(12) United States Patent
Arakawa et al.

(10) Patent No.: US 6,733,869 B2
(45) Date of Patent: May 11, 2004

(54) ELECTROMAGNETIC SHIELDING SHEET AND METHOD OF PRODUCING THE SAME

(75) Inventors: Fumihiro Arakawa, Tokyo-To (JP); Yasuhiko Ishii, Tokyo-To (JP); Daisuke Hashimoto, Tokyo-To (JP); Eiji Ohishi, Tokyo-To (JP); Yukihiro Kyoden, Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 10/370,098

(22) Filed: Feb. 21, 2003

(65) Prior Publication Data

US 2003/0164243 A1 Sep. 4, 2003

(30) Foreign Application Priority Data

Feb. 21, 2002 (JP) ......................................... 2002-044207

(51) Int. Cl.$^7$ .......................... B32B 15/02; B32B 15/08; B32B 3/10; B32B 3/24
(52) U.S. Cl. ..................... 428/195.1; 428/457; 428/607; 428/606; 428/612; 428/220; 428/304.4; 428/308.4; 428/314.8; 428/317.5; 257/659; 313/402; 313/479
(58) Field of Search ................. 428/195.1, 613, 428/209, 220, 304.4, 308.4, 314.8, 317.5, 457, 687, 607, 606, 612; 257/659; 313/402, 479

(56) References Cited

U.S. PATENT DOCUMENTS 5,855,988 A * 1/1999 Matsuo ..................... 428/195
6,143,674 A * 11/2000 Marutsuka ..................... 422/8
6,197,408 B1 * 3/2001 Kanbara et al. ............. 428/209
6,433,481 B1 * 8/2002 Marutsuka ................... 313/634
2002/0050783 A1 * 5/2002 Kubota et al. ............... 313/495
2003/0094296 A1 * 5/2003 Kojima et al. ......... 174/35 MS

FOREIGN PATENT DOCUMENTS

| JP | 01-278800 | 11/1989 |
| JP | 05-323101 | 12/1993 |
| JP | 11-119675 | 4/1999 |
| JP | 2001-210988 | 8/2001 |

* cited by examiner

Primary Examiner—Michael La Villa
(74) Attorney, Agent, or Firm—Parkhurst & Wendel, L.L.P.

(57) ABSTRACT

A metallic foil and a transparent substrate film are laminated with an adhesive layer. The roughness of the adhesive-layer-side surface (lower surface) of the metallic foil is such that the maximum height Rmax is more than 0 and less than 4 $\mu$m. As long as the maximum height Rmax falls in the range, the adhesive layer never contains air bubbles in such sizes that reflectance is adversely affected. The roughness of the surface (upper surface) of the metallic foil, opposite the adhesive-layer-side surface, is preferably such that the arithmetic mean roughness Ra is between 0.02 $\mu$m and 1 $\mu$m. As long as the arithmetic mean roughness Ra is in this range, it is possible to efficiently conduct vacuuming to bring, into close contact, a photosensitive resin layer and a photomask in sheet form placed on the photosensitive resin layer, before effecting the pattern-wise exposure of the photosensitive resin layer.

13 Claims, 3 Drawing Sheets

ELECTROMAGNETIC SHIELDING SHEET AND METHOD OF PRODUCING THE SAME

BACKGROUND OF THE INVENTION

1. Field of the Invention

The present invention relates to an electromagnetic shielding sheet that is placed on the observation side of an electromagnetic device such as a display to shield electromagnetic waves generated by the electromagnetic device, and through that the electromagnetic device can be seen. More particularly, the present invention relates to an electromagnetic shielding sheet composed of a net like metallic foil and a transparent substrate film that are laminated with an adhesive layer, and to a method for producing the same.

2. Description of Related Art

Electromagnetic waves generated by electromagnetic devices interfere with the normal functioning of other electromagnetic devices, and are also considered to adversely affect the human body and animals. In particular, plasma display panels (hereinafter referred simply to as "PDPs"), which have recently been put to practical use, produce electromagnetic waves with high frequencies of 30 to 130 MHz, so that they can affect computers or computerized devices located near the PDPs. It is therefore desirable to shield such electromagnetic waves as much as possible.

To shield electromagnetic waves, a variety of measures have already been taken. Proposed so far as an electromagnetic shielding means that can meet two essential requirements, electromagnetic shielding ability and visibility, are electromagnetic shielding sheets having both transparency and electro-conductivity, obtainable by forming transparent indium tin oxide (ITO) films on transparent substrate films (see Japanese Laid-Open Patent Publications No. 278800/1989 and No. 323101/1993, for example). It is, however, impossible to fully ensure electro-conductivity with such electromagnetic shielding sheets.

In view of the above drawback, electromagnetic shielding sheets, which are laminates of transparent substrate films and netlike metallic foils obtained by etching, have recently begun to be used (see Japanese Laid-Open Patent Publications No. 119675/1999 and No. 210988/2001, for example). These electromagnetic shielding sheets can satisfactorily shield even electromagnetic waves of high intensities generated by such electromagnetic devices as PDPs, if the thickness of the metallic foils and the size of the meshes of the nets are appropriately controlled. Moreover, these electromagnetic shielding sheets have sufficiently high transparency, so that images displayed on displays covered with them can be clearly seen through them.

Incidentally, a conventional process of producing an electromagnetic shielding sheet of the latter type is as follows: after laminating a metallic foil and a transparent substrate film with an adhesive layer, the metallic foil is made into net form by a photolithographic process.

SUMMARY OF THE INVENTION

In the production of an electromagnetic shielding sheet of the latter type, however, fine air bubbles tend to be incorporated into the adhesive layer while the metallic foil and the transparent substrate film are laminated.

To our knowledge, the generation of such air bubbles is mainly attributed to the roughened surfaces of the metallic foil, especially the one on which the adhesive layer will be formed (adhesive-layer-side surface), and air bubbles are more readily produced when the roughness of the adhesive-layer-side surface of the metallic foil is higher. The air bubbles thus incorporated into the adhesive layer not only impair the adhering properties of the adhesive layer but also irregularly reflect light to increase reflectance. An electromagnetic shielding sheet having an adhesive layer containing air bubbles can thus lower the image contrast when placed on a display such as a PDP.

The present invention has been accomplished in order to overcome the above drawback in the related art. An object of the present invention is therefore to provide an electromagnetic shielding sheet that can be obtained while preventing, in order to avoid increase in reflectance, incorporation of air bubbles in an adhesive layer during lamination of a metallic foil and a transparent substrate film with the adhesive layer. Another object of the present invention is to provide a method of producing such an electromagnetic shielding sheet.

To attain the above objects, the adhesive-layer-side surface of the metallic foil is specified, as will be described later in detail, to have such roughness that it can be smooth like mirror surface or the like. In general, a metallic foil has been processed so that its both surfaces can have almost the same smoothness. This means that if the adhesive-layer-side surface of the metallic foil is smooth, the other surface of the metallic foil is smooth as well. To make a metallic foil into net form, a photosensitive resin layer useful for etching is usually formed on the surface of the metallic foil, opposite to the adhesive-layer-side surface, and pattern-wise exposure is conducted with the use of a photomask in sheet form, which is placed on the surface of the photosensitive resin layer. To successfully conduct this pattern-wise exposure, it is necessary to bring the photosensitive resin layer and the photomask in sheet form into close contact, and, for this purpose, vacuuming is conducted before effecting pattern-wise exposure. If the surface of the metallic foil, opposite to the adhesive-layer-side surface, is smooth, the surface of the photo sensitive resin layer formed on this surface also becomes smooth. It is therefore not easy to exhaust, by vacuuming, the air confined between the smooth surface of the photosensitive resin layer and the photomask, and longer time is thus required for vacuuming.

A further object of the present invention is therefore to provide an electromagnetic shielding sheet capable of eliminating the above-described problem, that is, increase in time required for vacuuming needed for making a metallic foil into net form. A still further object of the present invention is to provide a method of producing such an electromagnetic shielding sheet.

An electromagnetic shielding sheet according to the present invention includes a transparent substrate film; and a netlike metallic foil with a densely spaced array of openings, laminated to one surface of the transparent substrate film with an adhesive layer; wherein at least the adhesive-layer-side surface of the metallic foil has such surface roughness that the maximum height Rmax defined in JIS (Japanese Industrial Standards) B0601 is more than 0 and less than 4 µm.

According to the electromagnetic shielding sheet of the present invention, the adhesive-layer-side surface of the metallic foil is specified to have such roughness that the upper limit of the maximum height Rmax is 4 µm, so that the adhesive layer never contains air bubbles in sizes unfavorable from the viewpoint of reflectance. Therefore, when this electromagnetic shielding sheet is placed on a display, the image contrast is scarcely lowered, and the image visibility is maintained high.

In the electromagnetic shielding sheet according to the present invention, it is preferable that the maximum height Rmax of the adhesive-layer-side surface of the metallic foil be more than 0 and 2 μm or less. As long as the maximum height Rmax falls in this range, even if the adhesive layer is of such a type that air bubbles incorporated into it grow during aging, it never contains, after aging, air bubbles that have grown to such sizes that reflectance is adversely affected.

Further, in the electromagnetic shielding sheet according to the present invention, the surface of the metallic foil, opposite to the adhesive-layer-side surface, has such surface roughness that the arithmetic mean roughness Ra defined in JIS B0601 is in the range between 0.02 μm and 1 μm. Since the surface of the metallic foil, opposite to the adhesive-layer-side surface, is specified to have such roughness that the lower limit of the arithmetic mean roughness Ra is 0.02 μm, it is easy to exhaust the air present between a photosensitive resin layer formed on this surface of the metallic foil and a photomask in sheet form placed on the photosensitive resin layer by vacuuming conducted before effecting pattern-wise exposure of the photosensitive resin layer. Operating efficiency is thus improved.

In addition, it is preferable that, in the electromagnetic shielding sheet according to the present invention, a surface subjected to darkening treatment is formed on the adhesive-layer-side surface of the metallic foil. It is also preferable that a surface subjected to darkening treatment is formed on the surface of the metallic foil, opposite to the adhesive-layer-side surface, wherein the reflectance of visible light at the surface subjected to darkening treatment is 5% or less. Since a surface subjected to darkening treatment, i.e., a darkening layer is formed on the adhesive-layer-side surface or both surfaces of the metallic foil, and the surface subjected to darkening treatment is specified so that the reflectance of visible light at the surface subjected to darkening treatment is 5% or less, the lowering of image contrast, which is usually caused when an electromagnetic shielding sheet is placed on a display, can more effectively be prevented.

In the electromagnetic shielding sheet according to the present invention, the adhesive layer can contain air bubbles and the diameters of these air bubbles are preferably less than 50 μm when reflectance is taken into consideration. Further, if the growth of air bubbles during aging is also taken into account, it is more preferable to control the diameters of air bubbles incorporated into the adhesive layer to 20 μm or less so that the air bubbles after aging will never adversely affect the reflectance.

A method of producing an electromagnetic shielding sheet according to the present invention includes the steps of making, as the base of an electromagnetic shielding sheet, a laminate by laminating a metallic foil to one surface of a transparent substrate film with an adhesive layer; laminating a photosensitive resin layer to the metallic foil in the laminate; conducting pattern-wise exposure by applying ionizing radiation to the photosensitive resin layer formed on the metallic foil in the laminate; developing the exposed photosensitive resin layer so that a resist layer can remain in the predetermined pattern; and etching the metallic foil in the laminate by making use of the resist layer to make the metallic foil into net form with a densely spaced array of openings; wherein at least the adhesive-layer-side surface of the metallic foil has such surface roughness that the maximum height Rmax defined in JIS B0601 is more than 0 and less than 4 μm.

According to the method of producing an electromagnetic shielding sheet of the present invention, the adhesive-layer-side surface of the metallic foil to be laminated to the transparent substrate film is specified to have such roughness that the upper limit of its surface roughness (maximum height Rmax) is 4 μm. Therefore, air bubbles in sizes unfavorable from the viewpoint of reflectance are not incorporated into the adhesive layer while the metallic foil and the transparent substrate film are laminated with the adhesive layer. It is thus possible to obtain an electromagnetic shielding sheet that scarcely lowers the image contrast and can maintain image visibility high when placed on a display.

In the method of producing an electromagnetic shielding sheet according to the present invention, it is preferable that the maximum height Rmax of the adhesive-layer-side surface of the metallic foil be more than 0 and 2 μm or less. As long as the maximum height Rmax falls in this range, even if the adhesive layer is of such a type that air bubbles incorporated into it grow during aging, it never contains, after aging, air bubbles that have grown to such sizes that reflectance is adversely affected.

In addition, the method of producing an electromagnetic shielding sheet according to the present invention further includes the step of placing a photomask in sheet form on the photosensitive resin layer and vacuuming to a predetermined pressure to bring the photosensitive resin layer and the photomask into close contact; wherein, in the step of conducting pattern-wise exposure, the ionizing radiation is applied to the photosensitive resin layer through the photomask, and at least the surface of the metallic foil, opposite to the adhesive-layer-side surface, has such surface roughness that the arithmetic mean roughness Ra defined in JIS B0601 is in the range between 0.02 μm and 1 μm. Since the surface of the metallic foil, opposite to the adhesive-layer-side surface, to which the photosensitive resin layer and the photomask in sheet form are laminated in the order mentioned, is specified to have such roughness that the lower limit of the arithmetic mean roughness Ra is 0.02 μm, it is easy to exhaust the air present between the photosensitive resin layer and the photomask placed thereon by vacuuming conducted before effecting the pattern-wise exposure of the photosensitive resin layer. Operating efficiency is thus improved.

In the method of producing an electromagnetic shielding sheet according to the present invention, the adhesive-layer-side surface or both surfaces of the metallic foil in the laminate may be subjected to darkening treatment. An electromagnetic shielding sheet containing a metallic foil that has been subjected to darkening treatment scarcely lowers the image contrast when placed on a display.

DETAILED DESCRIPTION OF PREFERRED EMBODIMENTS

By referring to the accompanying drawings, embodiments of the present invention will be described hereinafter.

Figure 1A:
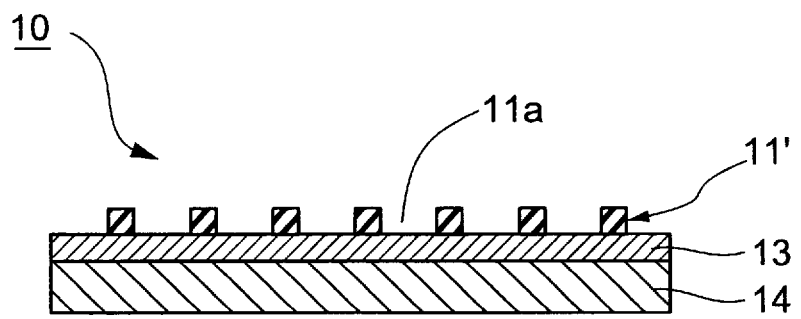
FIGS. 1A to 1C are views showing the constitution of an electromagnetic shielding sheet according to an embodiment of the present invention.
Figure 1B:
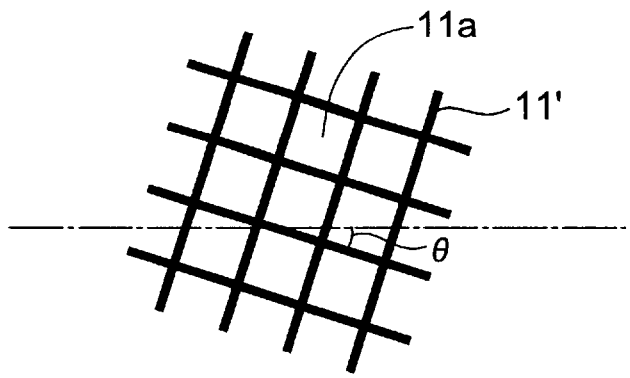
Figure 1C:
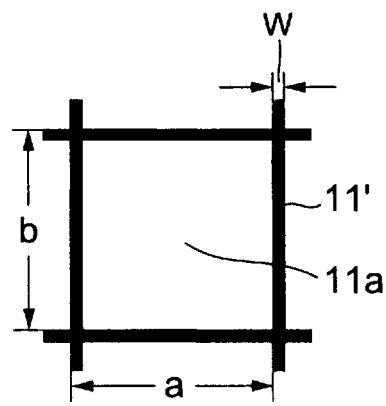

FIGS. 1A to 1C are cross-sectional views showing the constitution of an electromagnetic shielding sheet according to an embodiment of the present invention.

Entire Constitution

As shown in FIG. 1A, an electromagnetic shielding sheet 10 is composed of a netlike metallic foil 11' and a transparent substrate film 14, which are laminated with an adhesive layer 13. The netlike metallic foil 11' serves as an electromagnetic shielding layer having transparency, and may be either a metallic foil that has entirely been made into net form or a metallic foil only of which central part has been made into net form. Moreover, the netlike metallic foil 11' may be laminated to the entire surface of the transparent substrate sheet 14 or only to the central part of the surface of the transparent substrate sheet 14 Although not shown in this figure, protective films may be laminated to the upper and lower surfaces of the electromagnetic shielding sheet 10 In the accompanying drawings, the upper side of each figure corresponds to the observation side of the electromagnetic shielding sheet upon use, and the lower side, the rear side.

As shown in FIGS. 1A and 1B, the netlike metallic foil 11' has a densely spaced array of openings 11a. As shown in FIG. 1C, lines intersecting one another in the net have a narrow width between 5 µm and 20 µm. Although the horizontal pitch "a" and the vertical pitch "b" of the openings 11a may be the same or different, they are respectively in the order of 50 to 500 µm. It is preferable that the rate of the openings per unit area be approximately 90 to 95%. The lines extending in the horizontal direction (the horizontal direction of the electromagnetic shielding sheet upon use) may be inclined at a moderate angle θ, as shown in FIG. 1B. The "net" form is not limited to lattice form as shown in FIG. 1B. The opening 11a may be in any shape other than squares; it may be, for example, hexagonal (honeycombed), circular or oblong, and these shapes are herein all acceptable as the shape of the openings of the net.

Figure 1D:
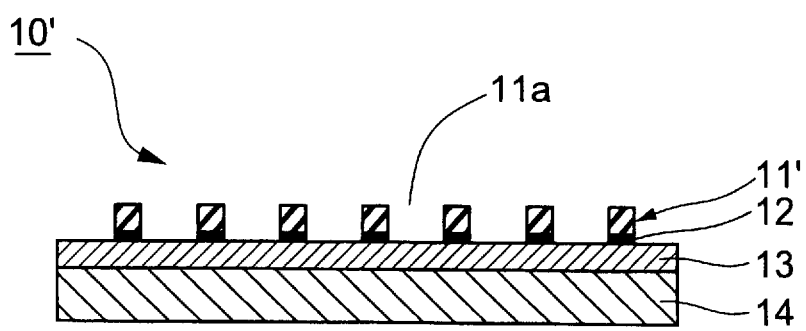
FIG. 1D is a view showing the constitution of an electromagnetic shielding sheet according to another embodiment the present invention.

In the embodiment shown in FIGS. 1A to 1C, the netlike metallic foil 11' is directly laminated to the adhesive layer 13. However, as shown in FIG. 1D, it is also possible to form a darkening layer (a surface subjected to darkening treatment) 12 on the adhesive-layer 13-side surface of the metallic foil 11' and laminate the metallic foil 11' to the adhesive layer 13 with the darkening layer 12 facing the adhesive layer 13. Further, although not shown in the figures, another darkening layer may also be formed on the surface of the metallic foil 11', opposite to the adhesive-layer 13-side surface.

Details of Constitution and Method for Production

Next, by referring to FIGS. 2(a) to 2(f), the process of production of the electromagnetic shielding sheet shown in FIGS. 1A to 1C will be described along with the details of the constitution of the electromagnetic shielding sheet.

Figure 2:
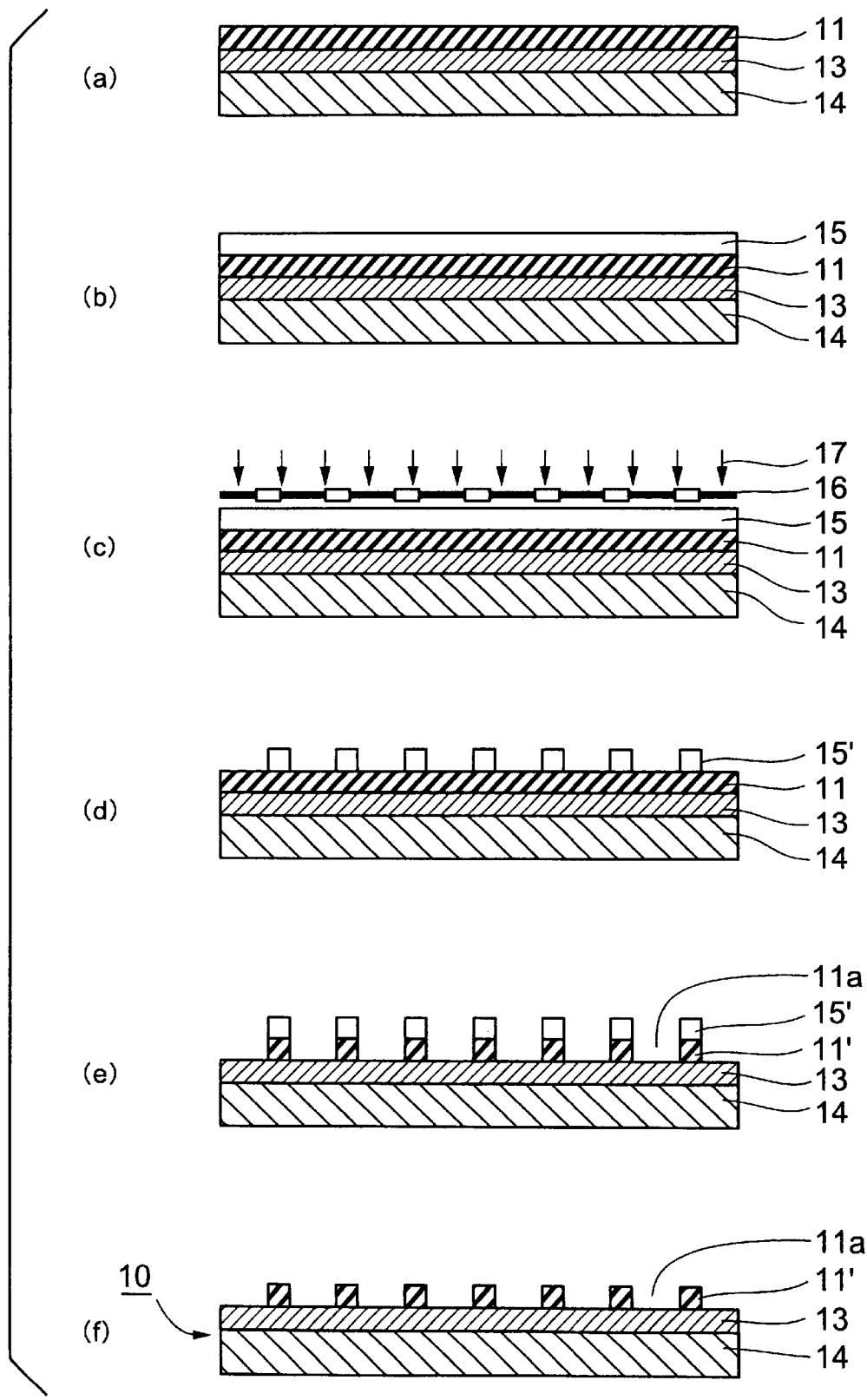
FIG. 2 is a flow sheet showing the process of production of the electromagnetic shielding sheet shown in FIGS. 1A to 1C.

As shown in FIG. 2 (a), a metallic foil 11 is firstly laminated to one surface of a transparent substrate film 14 with an adhesive layer 13 to obtain a laminate as the base of an electromagnetic shielding sheet.

Transparent Substrate Film

Examples of resins that can be used to form the transparent substrate film 14 include acrylic, polycarbonate, polypropylene, polyethylene, polystyrene, polyester, cellulose, polysulfone and polyvinyl chloride resins. In general, films of polyester resins such as polyethylene terephthalate resin, which are excellent in both mechanical strength and transparency, are favorably used for the transparent substrate film 14

There is no particular limitation on the thickness of the transparent substrate film 14 However, when mechanical strength and resistance to bending are taken into consideration, it is preferable that the thickness of the transparent substrate film 14 be between 50 µm and 200 µm. Although the transparent substrate film 14 can have a thickness of more than 200 µm, if the electromagnetic shielding sheet 10 is supposed to be laminated to any other transparent substrate upon use, the thickness of the transparent substrate film 14 is not necessarily greater than 200 µm. One surface or both surfaces of the transparent substrate film 14 may be subjected to corona discharge treatment or provided with an adhesion-promoting layer, as needed.

Metallic Foil

Non-limitative examples of materials for the metallic foil 11 includes metals such as copper, iron, nickel and chromium, alloys of some of these metals, and alloys based on one or more of these metals. It is preferable to use copper foil as the metallic foil 11 because it is excellent in electromagnetic shielding properties and handling properties and can easily be etched. Copper foils are classified into two types depending upon production process, rolled copper foil and electrolytic copper foil. It is herein preferable to use electrolytic copper foil as the metallic foil 11. The reason for this is as follows: it is easy to obtain uniformly formed electrolytic copper foil with a thickness as thin as 10 µm or less; and, in the case where a darkening layer is formed by plating, electrolytic copper foil shows excellent adhesion to the darkening layer.

The thickness of the metallic foil 11 is preferably between 1 µm and 100 µm, more preferably between 5 µm and 20 µm. If the metallic foil 11 is too thin, it cannot fully show electromagnetic shielding properties. On the other hand, if the metallic foil 11 is too thick, side etching takes place non-negligibly, so that it is difficult to make, by etching, openings in the metallic foil 11 with predetermined precision.

Surface Roughness of Metallic Foil

The side of the transparent substrate film 14, on which the metallic foil 11 is provided with the adhesive layer 13, corresponds to the observation side of the resulting electromagnetic shielding sheet 10 If air bubbles of 50 µm or more exist between the metallic foil 11 and the adhesive layer 13 or in the adhesive layer 13, irregular reflection of light occurs to increase reflectance. An electromagnetic shielding sheet 10 containing such large air bubbles thus lowers the image contrast when placed on a display.

The generation of such air bubbles is chiefly attributed to the roughened surfaces of the metallic foil 11, especially the roughened surface on the adhesive layer side. It is therefore preferable to use a metallic foil 11 whose surface roughness is in a specified range. Specifically, the roughness of at least the adhesive-layer-side surface of the metallic foil 11 is such that the maximum height Rmax defined in JIS B0601 is more than 0 and less than 4 µm, preferably more than 0 and 3 µm or less, more preferably more than 0 and 2 µm or less. The maximum height Rmax herein refers to a value expressed in micrometer (µm), obtained by sampling a portion with the reference length from the roughness curve in the direction of mean line, and measuring, in the longitudinal magnification direction of the roughness curve, the distance between the top of profile peak line and the bottom of profile valley line on this sampled portion.

When the maximum height Rmax of the metallic foil 11 as defined above is 4 µm or more, air bubbles having diameters of 50 µm or more are mechanically incorporated into the interface between the metallic foil 11 and the adhesive layer 13 while the metallic foil 11 and the adhesive layer 13 are laminated. These air bubbles then come into the adhesive layer 13 because they cannot enter the metallic foil 11. For this reason, the adhesive layer 13 generally contains air bubbles after the lamination process has been completed. When the value of the maximum height Rmax is smaller, the better results can be obtained. Practically, however, it is impossible to obtain a metallic foil 11 whose maximum height Rmax is 0, so that the lower limit of the maximum height Rmax is set at more than 0.

It is necessary to set the upper limit of the maximum height Rmax of the metallic foil 11 at a smaller value if a polyurethane resin adhesive agent such as that of two-pack curing type is used for the adhesive layer 13. The reason for this is as follows: in the case where the metallic foil 11 and the adhesive layer 13 made from a polyurethane resin adhesive agent such as that of two-pack curing type are laminated and aging is then effected, carbon dioxide gas generates as a by-product of the curing reaction and promotes the growth of air bubbles mechanically incorporated into the adhesive layer 13. Even if the air bubbles incorporated into the adhesive layer 13 grow due to the carbon dioxide gas, the diameters of the air bubbles that have grown never exceed 50 μm as long as the diameters of the air bubbles right after lamination are 30 μm or less, more preferably 20 μm or less. To control, to 30 μm or less, the diameters of air bubbles that are mechanically incorporated while the metallic foil 11 and the adhesive layer 13 are laminated, it is preferable that the maximum height Rmax of the adhesive-layer-side surface of the metallic foil 11 be more than 0 and 3 μm or less. To control the diameters of these air bubbles to 20 μm or less, it is preferable that the maximum height Rmax of the adhesive-layer-side surface of the metallic foil 11 be more than 0 and 2 μm or less.

In the above description, the roughness of at least the adhesive-layer-side surface of the metallic foil 11 is taken into account. In practical embodiments, however, both surfaces of the metallic foil 11 can be almost the same in terms of surface roughness.

Darkening Layer

FIGS. 2(a) to 2(f) show an embodiment in which a darkening layer 12 is not formed. However, the adhesive-layer 13-side surface of the metallic foil 11 may be subjected, in advance, to darkening treatment to form thereon a darkening layer 12, as shown in FIG. 1D. In addition to this darkening layer 12, another darkening layer may previously be formed on the surface of the metallic foil 11, opposite to the adhesive-layer 13-side surface, if necessary. These darkening layers can impart corrosion resistance and anti-reflection properties to the metallic foil 11. In the case where a darkening layer 12 is formed on the adhesive-layer 13-side surface of the metallic foil 11, the surface roughness of the darkening layer 12 to be laminated to the adhesive layer 13 is in the above-described range.

Such a darkening layer can be formed by a Co—Cu alloy plating process, for example, and can impart anti-reflection properties to the surface of the metallic foil 11. In addition to the formation of the darkening layer, chromate treatment may be conducted to impart corrosion resistance to the metallic foil 11. The manner in which chromate treatment is conducted is as follows: an object to be treated is immersed in a solution containing as a main component a chromic acid or a bichromate and is then dried to form a corrosion resistant film on the object. One surface or both surfaces of the metallic foil 11 may be subjected to this chromate treatment, as needed.

It is herein convenient to use, as the metallic foil 11, commercially available copper foil or the like that has already been subjected to the darkening and chromate treatments. If a metallic foil 11 that has not been subjected to the darkening treatment in advance is used, the darkening treatment is conducted at a proper timing in the course of the production process. For example, a plating process that can provide a dark film on the metallic foil 11 is employed to form a darkening layer. To form a darkening layer on the surface of the metallic foil 11, opposite to the adhesive-layer 13-side surface, the following manner may be employed: a photosensitive resin layer 15 that is laminated to the metallic foil 11 and can serve as a resist layer in the step that will be described later is formed with the use of a darkly-colored composition, and, after etching has been completed, the resist layer is not removed so that it can remain as a darkening layer on the metallic foil 11.

In the case where the observation-side surface (the surface opposite to the adhesive-layer 13-side surface) of the metallic foil 11 has been subjected to the darkening treatment, it is preferable that the reflectance of visible light at the darkening layer be 5% or less. This is because if the reflectance of visible light at the darkening layer is more than 5%, an electromagnetic shielding sheet 10 containing a metallic foil 11 provided with such a darkening layer lowers the image contrast when placed on a display. It is desirable that the reflectance of visible light be 0. Practically, however, the lower limit of the reflectance of visible light at a darkening layer formed on copper foil by the darkening treatment is approximately 1%.

Adhesive Layer

Any adhesive agent can be used for forming the adhesive layer 13 as long as it can allow the metallic foil 11 and the transparent substrate film 14, a resin film, to adhere to each other. However, after the metallic foil 11 is made into net form and the openings 11a are made (see FIGS. 1A to 1C), the adhesive layer 13 is to be seen through the openings 11a, so that the adhesive layer 13 is preferably colorless or nearly colorless and highly transparent. It is also preferable that the adhesive layer 13 does not undergo a change in color in the etching step that will be described later.

Specific examples of adhesive agents useful for forming the adhesive layer 13 include acrylic, polyester, polyurethane, polyvinyl alcohol, vinyl chloride/vinyl acetate copolymeric and ethylene/vinyl acetate copolymeric resins. In addition to these resins, thermosetting resins and ionizing-radiation-curing resins such as ultraviolet-curing resins and electron-beam-curing resins can also be used as adhesive agents. Of these adhesive agents, polyurethane resin adhesive agents and adhesive agents that are mixtures of saturated polyester resins and isocyanate curing agents are preferred because they can give high adhesion strength and scarcely undergo a change in color even when brought into contact with etching solutions. Saturated polyester resins, main agents of the latter adhesive agents, are particularly preferred because they show excellent adhesion to both metallic foils and resin films, scarcely undergo a change in color even at elevated temperatures and fully show flowability while lamination is conducted, and their glass transition temperatures can be controlled by adjusting their molecular weights.

It is preferable, as mentioned above, that the adhesive layer 13 be substantially colorless and transparent in the final product (i.e., the final product in such a state that the etching solution has been acted on the adhesive layer in the etching step). Specifically, the b* value in the L*a*b* color system of the adhesive layer 13 is preferably in the range between −6.0 and 6.0. If the b* value is less than −6.0, the adhesive layer 13 appears bluish. On the other hand, if the b* value is more than 6.0, the adhesive layer 13 appears yellowish, and, when an electromagnetic shielding sheet containing such an adhesive layer is placed on the observation side of a display such as a PDP, the brightness of blue color is decreased. When an ordinary adhesive agent, which is usually an organic material, is used to form the adhesive layer 13, the resulting adhesive layer 13 has, in most cases, a b* value of 1.0 or more. If this point is also taken into consideration, it is preferable that the b* value of the adhesive layer 13 be from 1.0 to 6.0.

As mentioned previously, a thin metallic foil suitable for the metallic foil 11 is electrolytic copper foil, which can be obtained by immersing an electrode drum in copper electrolyte, allowing electric current to flow through the electrode drum to electrode posit thereon copper foil, and peeling the copper foil from the electrode drum. However, electrolytic copper foil obtained in the above-described manner has roughened surfaces; especially the surface of the electrolytic copper foil, which has been placed at the opposite side of the electrode drum in the electrodeposition process, has such surface roughness that the arithmetic mean roughness Ra is in the order of 0.1 to 1.0 $\mu$m. Although such a roughened surface is convenient as a surface on the observation side, which will be subjected to darkening treatment, it is unfavorable as a surface on the adhesive-layer 13-side because air bubbles are easily incorporated into the interface between the metallic foil 11 and the adhesive layer 13 during lamination of these two constituents. However, it is possible to avoid the incorporation of air bubbles by controlling the nip temperature in the lamination step, if an adhesive agent having a glass transition temperature of 20 to 100° C. is used.

In view of smoothening of the roughened surface of the electrolytic copper foil, it is preferable to apply the adhesive agent in an amount of 1–10 g/m$^2$ on dry basis. If the adhesive agent is applied in an amount of less then 1 g/m$^2$, the adhesive layer formed cannot give satisfactorily high adhesion strength. On the other hand, even if the adhesive agent is applied in an amount of more than 10 g/m$^2$, improvement in adhesion strength cannot be attained. Moreover, the adhesive agent applied does not fully dry by the end of the application step, and, if the adhesive layer undergoes a change in color, the change is noticeable.

In general, a lamination process using the adhesive layer 13 is employed to laminate the metallic foil 11 and the transparent substrate film 14. Since both the metallic foil 11 and the transparent substrate film 14 are adhesive-impermeable materials, it is preferable to adopt a dry lamination process, in which an adhesive agent solution is applied to a surface of either one of or both of the metallic foil 11 and the transparent substrate film 14 and is then dried, and the dried adhesive agent is reactivated by heating. In such a dry lamination process, it is generally preferable that the adhesive agent be applied only to the surface of the transparent substrate film 14. In the case where a film of a hot-melt resin such as an ethylene/vinyl acetate copolymeric resin or an ionomer is used, as the transparent substrate film 14, either singly or as a laminate with other resin film, part of the transparent substrate film 14 can serve as an adhesive layer. In this case, therefore, it is not necessary to separately provide an adhesive layer when the lamination of the metallic foil 11 and the transparent substrate film 14 is conducted.

After preparing, in the above-described manner, the laminate as the base of an electromagnetic shielding sheet, a photosensitive resin layer 15 that can serve as a resist layer in the subsequent etching step is laminated to the metallic foil 11 in the laminate, as shown in FIG. 2(b), and is then made into net form by a so-called photolithographic process.

Specifically, as shown in FIG. 2(c), a photomask 16 in sheet form is placed on the surface of the photosensitive resin layer 15, and ionizing radiation such as ultraviolet light is applied to the photosensitive resin layer 15 through the photomask 16 to effect pattern-wise exposure. Although the photosensitive resin layer 15 is described as being of negative type in this specification including the drawings, a photosensitive resin layer of positive type can also be used.

When the pattern-wise exposure is effected, it is necessary that the photosensitive resin layer 15 and the photomask 16 in sheet form be in close contact. Therefore, before effecting the pattern-wise exposure, vacuuming is conducted to a predetermined pressure with the use of a vacuum-baking frame.

If the surface of the metallic foil 11 to which the photosensitive resin layer 15 will be laminated (the surface opposite to the adhesive-layer 13-side surface) is smooth (mirror surface), the photosensitive resin layer 15 laminated to this surface also has a smooth surface (mirror surface). It is therefore not easy to exhaust, by vacuuming, the air confined between the smooth surface of the photosensitive resin layer 15 and the photomask 16 in sheet form, and vacuuming to a pressure of 1 Pa, for instance, thus requires long time.

On the contrary, if the surface of the metallic foil 11 to which the photosensitive resin layer 15 will be laminated has a certain degree of roughness, the photosensitive resin layer 15 laminated to this surface has a roughened surface as well. The air confined between the roughened surface of the photosensitive resin layer 15 and the photomask 16 in sheet form can thus easily be exhausted by vacuuming to improve operating efficiency.

From the above-described point of view, it is preferable that the-surface of the metallic foil 11, to which the photosensitive resin layer 15 will be laminated, has such surface roughness that the arithmetic mean roughness Ra defined in JIS B0601 is in the range between 0.02 $\mu$m and 1 $\mu$m. As long as the arithmetic mean roughness Ra of this surface of the metallic foil 11 is at least about 0.02 $\mu$m, vacuuming to a desired pressure with the use of a conventional vacuum-baking frame can be completed within approximately 1 minute. In the case where electrolytic copper foil is used as the metallic foil 11, the roughness of the surface of the metallic foil 11 to which the photosensitive resin layer 15 will be laminated is determined by the surface roughness of an electrode drum on which electrolytic copper foil will be deposited. It is therefore possible to control the surface roughness of the metallic foil 11 by treating the surface of the electrode drum by polishing or the like to control its surface roughness to a desired degree.

When the arithmetic mean roughness Ra is greater, better results can be obtained in terms of vacuuming time. However, a metallic foil 11 having a surface whose arithmetic mean roughness Ra is more than 1 $\mu$m is prone to entirely distort, and after it has been made into net form, the linear edges of lines intersecting one another in the net have an unfavorably irregular appearance. For this reason, the upper limit of the arithmetic mean roughness Ra of the photosensitive-resin-layer 15-side surface of the metallic foil 11 is set at approximately 1 $\mu$m.

That the arithmetic mean roughness Ra of the photosensitive-resin-layer 15-side surface of the metallic foil 11 is at least 0.02 $\mu$m is also effective in controlling the reflectance of visible light at the observation-side surface of the metallic foil 11 (or at the surface of the darkening layer, if formed) to 5% or less. This is because that the observation-side surface of the metallic foil 11 has a lower degree of mirror-smoothness is favorable from the viewpoint of controlling of reflectance.

Photolithographic Process

To make the metallic foil 11, a constituent of the laminate shown in FIG. 2(a), into net form, the photosensitive resin layer 15 is firstly laminated to the metallic foil 11, as shown in FIG. 2(b). Thereafter, as shown in FIG. 2(c), a photomask 16 in sheet form is brought into close contact with the surface of this photosensitive resin layer 15, and ionizing radiation 17 such as ultraviolet light is applied to the photosensitive resin layer 15 through the photomask 16 to conduct pattern-wise exposure of the photosensitive resin layer 15. In this step, however, the use of the photomask 16 is not essential, and any other technique such as scanning of an electron beam can be employed as long as it can eventually attain the pattern-wise exposure of the photosensitive resin layer 15.

If the photosensitive resin layer 15 is of negative type, the exposed portions of the photosensitive resin layer 15 are cured and become insoluble in a developer, while the unexposed portions have developer solubility. On the other hand, if the photosensitive resin layer 15 is of positive type, the exposed portions are decomposable and soluble in a developer.

Thereafter, the exposed photosensitive resin layer 15 is developed with the use of a developer. Specifically, the soluble portions of the photosensitive resin layer 15, which have been distinguished from the insoluble portions by the above-described pattern-wise exposure, are removed by dissolving them in a developer that has been selected in advance depending upon the type of the photosensitive resin used for forming the photosensitive resin layer 15. When the photosensitive resin layer 15 is of negative type, the cured photosensitive resin layer 15' remains in a predetermined pattern on the metallic foil 11, as shown in FIG. 2(d).

By using, as a resist layer, this photosensitive resin layer 15' remaining in a predetermined pattern on the metallic foil 11, the metallic foil 11 is etched. The etching of the metallic foil 11 is conducted by using a proper etching solution until those parts of the metallic foil 11 that are not covered with the resist layer are dissolved to become openings in the desired shape.

Obtainable from the above-described etching step is a netlike metallic foil 11' with a densely spaced array of openings 11a as shown in FIG. 2(e). At the end of the etching step, the cured resist layer (photosensitive resin layer 15') is still remaining on the netlike metallic foil 11', so that the remaining resist layer is usually removed by a resist remover. Thus, the netlike metallic foil 11' with a densely spaced array of openings 11a is bared as shown in FIG. 2(f), and an electromagnetic shielding sheet 10 of such a constitution in which the netlike metallic foil 11' and the transparent substrate film 14 are laminated with the adhesive layer 13 is finally obtained.

Although the electromagnetic shielding sheet 10 of the above-described constitution is produced substantially in the aforementioned manner, the step of degreasing or cleaning the surface of the metallic foil 11 to be made into net form, the step of washing away the resist remover after removing the remaining resist layer (photosensitive resin layer 15'), and the like may be added before or after or in the above-described production process, as needed.

Protective Film

A protective film may be laminated to the front and/or rear surface (i.e., the netlike metallic foil 11' side and/or the transparent substrate film 14 side) of the electromagnetic shielding sheet 10 obtained in the above-described manner.

If a protective film is provided on the netlike metallic foil 11' side of the electromagnetic shielding sheet 10, the narrow lines in the netlike metallic foil 11' are protected from cutting that is caused by contact or the like. If a protective film is provided on the transparent substrate film 14 side of the electromagnetic shielding sheet 10, the bared surface of the transparent substrate film 14 is protected from damages that are caused during handling or by accidental contact or the like. Furthermore, by laminating a protective film to the transparent substrate film 14 before starting the aforementioned production process, it is possible to protect the bared surface of the transparent substrate film 14 from staining or erosion in the etching step.

Figure 3:
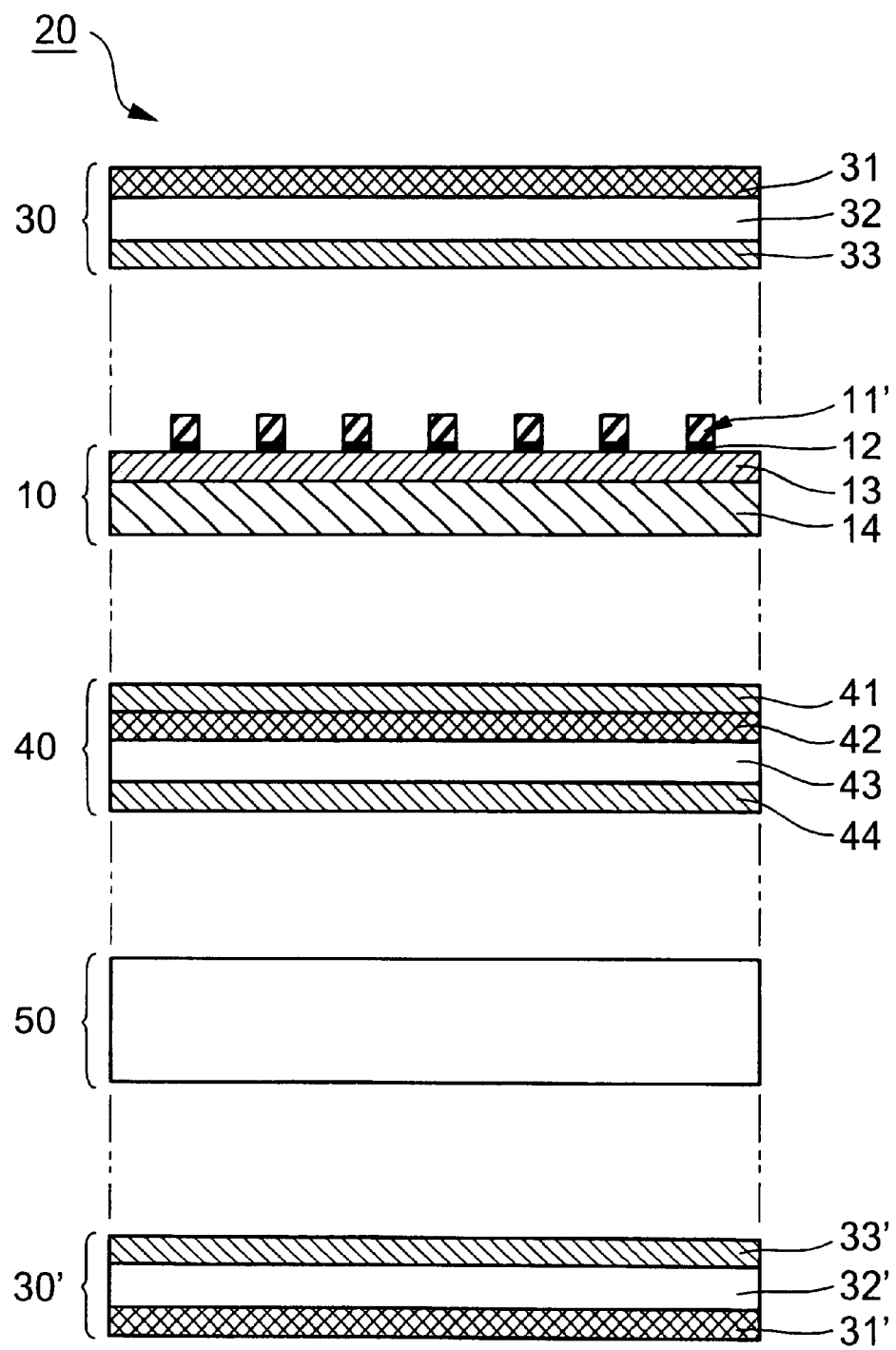
FIG. 3 is a view showing an electromagnetic shielding panel that contains the electromagnetic shielding sheet shown in FIGS. 1A to 1C.

To the front and rear surfaces of the electromagnetic shielding sheet 10, a variety of layers are laminated to finally obtain an electromagnetic shielding panel as shown in FIG. 3. Before laminating these layers to the electromagnetic shielding sheet 10, it is necessary to strip the protective films from the front and rear surfaces of the electromagnetic shielding sheet 10 The protective films laminated to the electromagnetic shielding sheet 10 should therefore be strippable. Specifically, the peel force required for peeling the protective film from the electro magnetic shielding sheet 10 is preferably from 5 mN/25-mm width to 5 N/25-mm width, more preferably from 10 mN/25-mm width to 100 mN/25-mm width. If this peel force is less than the above-described lower limit, the protective film peels off very easily; it can come off during handling or by careless contact. On the other hand, if the peel force is more than the above-described upper limit, a great force is required to strip the protective film from the electromagnetic shielding sheet 10 Moreover, in the case where the protective film has been laminated to the netlike metallic foil 11', the netlike metallic foil 11' can be removed together with the protective film when the protective film is stripped from the electromagnetic shielding sheet 10

Electromagnetic Shielding Panel

As mentioned above, the electromagnetic shielding sheet 10 is incorporated into an electromagnetic shielding panel 20, as shown in FIG. 3. FIG. 3 is a diagrammatic view showing an electromagnetic shielding panel 20 containing the electromagnetic shielding sheet 10 shown in FIGS. 1A to 1C. The upper side of FIG. 3 corresponds to the observation side of the electromagnetic shielding panel 20, while the lower side, the rear side. Such an electromagnetic shielding panel 20, as a whole, is placed on the observation side of a display such as a PDP (not shown in the figure).

In the electromagnetic shielding panel 20, an observation side film (front surface film) 30 is provided on the metallic foil 11' side of the electromagnetic shielding sheet 10, and a near-infrared-absorbing film 40, a glass substrate 50 and a rear surface film (back surface film) 30' are successively laminated to the transparent substrate film 14 in the electromagnetic shielding sheet 10, as shown in FIG. 3. In this figure, the observation side film 30, the electromagnetic shielding sheet 10, the near-infrared-absorbing film 40, the glass substrate 50 and the rear surface film 30' are shown as being separated from each other. This is only for a clearer understanding, and actually, these five constituents are laminated in close contact.

The observation side film 30 is a laminate of a pressure-sensitive adhesive layer 33, a base film 32 and a multi-layered film 31, which are successively laminated in this order, and is laminated to the electromagnetic shielding sheet 10 with the pressure-sensitive adhesive layer 33 facing the metallic foil 11' in the electromagnetic shielding sheet 10. The multi-layered film 31 is a laminate of a hard coat layer, an anti-reflection layer, an anti-staining layer, etc. that are laminated successively.

The near-infrared-absorbing film 40 is a laminate of a pressure-sensitive adhesive layer 41, a near-infrared-absorbing layer 42, a base film 43 and a pressure-sensitive adhesive layer 44, which are successively laminated in the order stated, and is laminated to the electromagnetic shielding sheet 10 with the pressure-sensitive adhesive layer 41 facing the transparent substrate film 14 in the electromagnetic shielding sheet 10

The glass substrate 50 has the function of maintaining the mechanical strength, self-supportability and flatness of the entire electromagnetic shielding panel 20.

The rear surface film 30' is the same as the observation side film 30. This film is a laminate of a pressure-sensitive adhesive layer 33', a base film 32' and a multi-layered film 31', which are successively laminated in this order, and is laminated to the glass substrate 50 with the pressure-sensitive adhesive layer 33' facing the glass substrate 50.

The electromagnetic shielding panel 20 shown in FIG. 3 is only an example. Although it is preferable that all of the above-described five laminates be laminated, it is possible to properly alter this constitution by omitting some of these constituent laminates, as needed, or by using an alternate laminate having the functions of some of the constituent laminates.

EXAMPLES

Example 1

A transparent polyethylene terephthalate resin (PET) film having a width of 700 mm and a thickness of 100 μm (item number A4300, manufactured by Toyobo Co., Ltd., Japan), and copper foil having a width of 700 mm and a thickness of 10 μm, whose one surface had been subjected to darkening treatment were prepared. The surfaces of the copper foil had the following surface roughness: Rmax and Ra of the surface to which an adhesive layer would be laminated (the adhesive-layer-side surface) were 0.6 μm and 0.21 μm, respectively, and Ra of the surface to which a resist layer would be laminated (the surface opposite to the adhesive-layer-side surface) was 0.2 μm. By a dry lamination process, these two materials were continuously laminated with the darkened surface of the copper foil facing inside to obtain a laminated sheet with a total thickness of 115 μm. An adhesive agent used in this lamination process is a two-pack curing polyurethane resin adhesive agent manufactured by Takeda Chemical Industries, Ltd., Japan, which was a 12:1:21 (weight basis) mixture of Takelac A310 (main agent): Takenate A10 (curing agent): ethyl acetate.

Using a laminator roller, a protective film (item number HT-25, manufactured by Panac Co., Ltd, Japan) having a total thickness of 28 μm was laminated to the PET film in the above-obtained laminated sheet, on the side the copper foil was not present. This protective film contained a PET film base. A pressure-sensitive adhesive layer had been laminated to the surface of this PET film base that would be faced to the laminated sheet when laminating the protective film to the laminated sheet, and the other surface of the PET film base had been subjected to corona discharge treatment.

Thus, a laminate of the protective film/PET film/adhesive layer/copper foil was finally obtained. In this specification, the symbol "/" used in the description of a laminate means that the two materials written before and after the symbol "/" have been integrally laminated.

Casein was applied to the copper foil in the above-obtained protected laminate, and was then dried to form a photosensitive resin layer. Thereafter, a photomask in sheet form was placed on this photosensitive resin layer, and these two were brought into close contact by conducting vacuuming using a vacuum-baking frame. Ultraviolet light was then applied to effect contact exposure. The photomask used had a netlike pattern with a pitch of 300 μm, a line width of 10 μm, and a total size of 600 mm×800 mm.

After effecting contact exposure in the above-described manner, the photosensitive resin layer was developed by using water as a developer. The developed photosensitive resin layer was hardened, and was then baked at a temperature of 100° C. to obtain a patterned resist layer.

A ferric chloride solution (Baumé degree: 42, temperature 60° C.) was sprayed over the patterned resist layer on the laminate to conduct etching. After washing with water, the patterned resist layer was removed by the use of an alkaline solution. Thereafter, washing and drying were conducted to obtain a protected electromagnetic shielding sheet consisting of the protective film/PET film/adhesive layer/netlike copper foil.

Examples 2 to 5 and Comparative Examples 1 to 3

The procedure of Example 1 was repeated, provided that copper foils having Rmax and Ra values as shown in Table 1 were employed instead of the copper foil used in Example 1, thereby obtaining protected electromagnetic shielding sheets of Examples 2 to 5 and Comparative Examples 1 to 3, each consisting of the protective film/PET film/adhesive layer/netlike copper foil.

Results of Evaluation

The protected electromagnetic shielding sheets of Examples 1 to 5 and Comparative Examples 1 to 3 were evaluated in terms of Rmax, Ra, air bubbles (existence of air bubbles and their sizes (diameters in μm)), time (seconds) required for vacuuming, and appearance. The results are shown in Table 1. The "vacuuming time" in the table refers to the time taken before the degree of vacuum reached 1 Pa, measured from the beginning of vacuuming that was conducted with the use of a vacuum-baking frame to bring, into close contact, the photosensitive resin layer and the photomask in sheet form placed on the photosensitive resin layer. It is preferable that the vacuuming time be less than 100 seconds. The "appearance" was evaluated by visually observing the electromagnetic shielding sheets whether they were opaque or turbid due to the existence of air bubbles and whether they had undergone a change in color. In the table, those electromagnetic shielding sheets that were found to be considerably poor in appearance are marked with "NG", while those ones that were found excellent in appearance are marked with "OK". The electromagnetic shielding sheets of Examples 1 to 5 were good in all the items evaluated; while those of Comparative Examples 1 and 2 were poor in "appearance", and that of Comparative Example 3 was poor in "vacuuming time" (excessively long time was required for vacuuming).

TABLE 1

| SAMPLE | Surface Roughness of Copper Foil | | | Air Bubbles (μm) | Vacuuming Time (sec) | Appearance |
|---|---|---|---|---|---|---|
| | Adhesive Surface | | Resist Surface | | | |
| | Rmax (μm) | Ra (μm) | Ra (μm) | | | |
| Ex. 1 | 0.6 | 0.21 | 0.21 | none | 30 | OK |
| Ex. 2 | 0.6 | 0.02 | 0.02 | none | 90 | OK |
| Ex. 3 | 2 | 0.20 | 0.20 | 20 | 25 | OK |
| Ex. 4 | 3 | 0.30 | 0.30 | 30 | 23 | OK |
| Ex. 5 | 3.8 | 0.31 | 0.31 | 45 | 23 | OK |
| Comp. Ex. 1 | 6 | 0.43 | 0.43 | 100 | 20 | NG |
| Comp. Ex. 2 | 4 | 0.32 | 0.32 | 50 | 23 | NG |
| Comp. Ex. 3 | 0.6 | 0.01 | 0.01 | none | 110 | OK |

What is claimed is:

1. An electromagnetic shielding sheet comprising:

a transparent substrate film; and a metallic foil with a densely spaced array of openings, laminated to one surface of the transparent substrate film with an adhesive layer;

wherein a thickness of the metallic foil is between 5 μm and 100 μm and at least an adhesive-layer-side surface of the metallic foil has such surface roughness that a maximum height Rmax defined in JIS B0601 is more than 0 and less than 4 μm.

2. The electromagnetic shielding sheet according to claim 1, wherein the maximum height Rmax is more than 0 and 2 μm or less.

3. The electromagnetic shielding sheet according to claim 1, wherein a surface subjected to darkening treatment is formed on the adhesive-layer-side surface of the metallic foil, the surface subjected to darkening treatment having said surface roughness.

4. The electromagnetic shielding sheet according to claim 1, wherein a surface subjected to darkening treatment is formed on the surface of the metallic foil, opposite to the adhesive-layer-side surface, wherein a reflectance of visible light at the surface subjected to darkening treatment is 5% or less.

5. The electromagnetic shielding sheet according to claim 1, wherein the thickness of the metallic foil is between 5 μm and 20 μm.

6. An electromagnetic shielding sheet comprising:

a transparent substrate film; and a metallic foil with a densely spaced array of openings, laminated to one surface of the transparent substrate film with an adhesive layer;

wherein at least an adhesive-layer-side surface of the metallic foil has such surface roughness that a maximum height Rmax defined in JIS B0601 is more than 0 and less than 4 μm and the adhesive layer contains air bubbles having diameters of less than 50 μm.

7. The electromagnetic shielding sheet according to claim 6, wherein the adhesive layer contains air bubbles having diameters of 20 μm or less.

8. An electromagnetic shielding sheet comprising:

a transparent substrate film; and a metallic foil with a densely spaced array of openings, laminated to one surface of the transparent substrate film with an adhesive layer;

wherein at least an adhesive-layer-side surface of the metallic foil has such surface roughness that a maximum height Rmax defined in JIS B0601 is more than 0 and less than 4.0 μm and at least a surface of the metallic foil, opposite to the adhesive-layer-side surface, has such surface roughness that an arithmetic mean roughness Ra defined in JIS B0601 is in a range between 0.02 μm and 1 μm.

9. The electromagnetic shielding sheet according to claim 8, wherein the maximum height Rmax is more than 0 and 2 μm or less.

10. The electromagnetic shielding sheet according to claim 8, wherein a surface subjected to darkening treatment is formed on the adhesive-layer-side surface of the metallic foil, the surface subjected to darkening treatment having said surface roughness.

11. The electromagnetic shielding sheet according to claim 8, wherein a surface subjected to darkening treatment is formed on the surface of the metallic foil, opposite to the adhesive-layer-side surface, wherein a reflectance of visible light at the surface subjected to darkening treatment is 5% or less.

12. The electromagnetic shielding sheet according to claim 8, wherein the adhesive layer contains air bubbles having diameters of less than 50 μm.

13. The electromagnetic shielding sheet according to claim 8, wherein the adhesive layer contains air bubbles having diameters of 20 μm or less.

* * * * *